(12) United States Patent
Pringle et al.

(10) Patent No.: US 9,149,033 B2
(45) Date of Patent: *Oct. 6, 2015

(54) CAMOUFLAGE COVERING USING COMPOSITIONS WITH SURFACES WHICH CONSTITUTE ANIMAL METAMERS

(71) Applicants: Todd A. Pringle, Reiles Acres, ND (US); Brian M. Tande, Grand Forks, ND (US)

(72) Inventors: Todd A. Pringle, Reiles Acres, ND (US); Brian M. Tande, Grand Forks, ND (US)

( * ) Notice: Subject to any disclaimer, the term of this patent is extended or adjusted under 35 U.S.C. 154(b) by 242 days.

This patent is subject to a terminal disclaimer.

(21) Appl. No.: 14/021,023

(22) Filed: Sep. 9, 2013

(65) Prior Publication Data

US 2014/0004279 A1 Jan. 2, 2014

Related U.S. Application Data

(63) Continuation of application No. 12/876,230, filed on Sep. 6, 2010, now Pat. No. 8,528,248.

(51) Int. Cl.
| | |
|---|---|
| *A01M 31/06* | (2006.01) |
| *G01J 3/46* | (2006.01) |
| *G02B 21/36* | (2006.01) |
| *G06F 17/50* | (2006.01) |
| *A01K 75/02* | (2006.01) |
| *G06F 17/10* | (2006.01) |
| *G06F 7/60* | (2006.01) |
| *A01N 3/00* | (2006.01) |
| *A41G 1/00* | (2006.01) |

(52) U.S. Cl.
CPC ............... *A01M 31/06* (2013.01); *G01J 3/465* (2013.01); *G02B 21/365* (2013.01); *G06F 17/50* (2013.01)

(58) Field of Classification Search
USPC ............... 43/2, 3, 17.5, 17.6, 42.32, 42.33; 255/582, 586; 428/15, 17; 703/2
See application file for complete search history.

(56) References Cited

U.S. PATENT DOCUMENTS

| | | | | |
|---|---|---|---|---|
| 4,691,464 | A | * | 9/1987 | Rudolph .............................. 43/3 |
| 7,966,764 | B2 | * | 6/2011 | Johnson et al. ..................... 43/3 |
| 8,528,248 | B2 | * | 9/2013 | Pringle et al. ....................... 43/2 |
| 8,650,795 | B2 | * | 2/2014 | Johnson et al. ..................... 43/2 |
| 2006/0117637 | A1 | * | 6/2006 | Jeckle .................................. 43/3 |
| 2009/0000177 | A1 | | 1/2009 | Johnson et al. |
| 2011/0253011 | A1 | | 10/2011 | Johnson et al. |

OTHER PUBLICATIONS

Ver Cauteren and Pipas. "A revieW of color vision in White tailed deer." Wildlife Society Bulletin, 31(3):684-691, 2003.
Hart, Partridge, and Cuthill. "Visual pigments, cone oil drop lets, ocular media, and pred. spec. sens. in the domestic turkey" Vision ReseaRCH 39, 3321-3328, 1999.

(Continued)

*Primary Examiner* — Bijan Ahvazi
(74) *Attorney, Agent, or Firm* — Brainstorm Consulting, LLC; Jonathan L. Tolstedt

(57) ABSTRACT

A camouflage covering which has a surface coating composition which is a metamer of a natural object from an environment of an animal, such as plant life or soil, as perceived by the vision system of the animal, which is created by completing the steps of creating a mathematical model of the vision system of the animal, measuring a set of spectral characteristics from the natural object, entering the set of spectral characteristics as an input into the mathematical model, and using an output of the mathematical model to iteratively create the surface coating composition.

2 Claims, 5 Drawing Sheets

(56) References Cited

OTHER PUBLICATIONS

Komer, Schlupp, Plath, and LoeW. "Spectral sensitivity of mollies: comparing surface- and cave-dwelling Atlantic mollies" Journal of Fish Biology 69, 54-65, 2006.

Carleton, Harosi, and Kocher. "Visual pigments of African cichlid fshes: evidence for UV vision from microspectrophotometry and DNA seq." Vision Research 40, 879-890, 1999.

Losey, Cronin, Goldsmith, Hyde, Marshall, and McFarland. "The UV visual World of fishes: a revieW." Journal of Fish Biology 54, 921-943, 1999.

Siebeck and Marshall. "Transmission of ocular media in labrid fishes." Phil. Trans. R. Soc. Lond. B 355, 1257-1261, 2005.

Ringvold et al. "UV-Absorbing Compounds in the Aqueous Humor from Aquatic Mammals and Various Non-Mammalian Vert." Ophthalmic Res 35, 208-216, 2003.

Nelson, ZamZoW, and Losey. "Ultraviolet blocking in the ocular humors of the teleost fish *Acanlhocybium solandri* (Scombridae)." Can. J. Zool. 79, 1714-1718, 2001.

Non-Final Office Action for U.S. Appl. No. 12/876,230, mailed on Dec. 21, 2012., and Remarks from Applicant in Response to said Non-Final Office Action, p. 5.

Notice of Allowance and Fees Due for U.S. Appl. No. 12/876,230, mailed May 14, 2013.

Hart and Hunt. "Avian Visual Pigments: Characteristics, Spectral Tuning, and Evolution." The American Naturalist, vol. 169, Jan. 2007.

Cuthill, Hart, Partridge, Bennett, Hunt, and Church, "Avian colour vision and avian video playback experiments." Acta Ethol 3:29-37, 2000.

Fritsches, Partridge, PettigreW and Marshall. "Colour vision in bill fish." Phil. Trans. R. Soc. Lond. B, 2000.

Losey, Nelson, and ZamZoW. "Ontogeny of Spectral Transmission in the Eye of the Tropical Damselfish, and Possible Effects . . . " Environmental Biology of Fishes, 59: 21-28, 2000.

Eaton. "Human vision fails to distinguish Widespread sexual dichromatism among sexually 'monochromatic' birds." PNAS, vol. 102, No. 31, Aug. 2, 2005.

Levenson et al. "Visual pigments of marine carnivores" Journal of Comparative Physiology A-Neuroethology Sensory Neural and Behavioral Physiology. 192 (8), pp. 833-843, 2006.

Odeen and Hastad. "Complex Distribution of Avian Color Vision Systems Revealed by Sequencing the SWSI Opsin from Total DNA." Mol. Biol. Evol., 20(6):855-861, 2003.

BoWmaker. "Evolution, ecology and spectral tuning of teleost visual pigments." Iugoslav Physiol Pharmacol Acta, vol. 34, No. 2, 289-303, 1998.

Carroll, Murphy, M. NeitZ, Ver Hoeve, and J. NeitZ. "Photo pigment basis for dichromatic color vision in the horse." Journal ofVision 1, 80-87, 2001.

Beaudet, Flamarique, and HaWryshyn. "Cone Photoreceptor Topography in the Retina of Sexually Mature Paci?c Salmonid Fishes", Jour. of Comparative Neurology, 383:49-59, 1997.

\* cited by examiner

CAMOUFLAGE COVERING USING COMPOSITIONS WITH SURFACES WHICH CONSTITUTE ANIMAL METAMERS

CROSS-REFERENCE TO RELATED PATENT APPLICATIONS

The present application is a continuation of U.S. application Ser. No. 12/876,230, entitled "Method of creating animal metamers and compositions with surfaces which constitute animal metamers", filed on Sep. 6, 2010.

FIELD OF THE INVENTION

The present invention relates generally to methods and compositions which elicit desired behaviors in animals by visual stimuli and more particularly methods and compositions which can enhance man's interaction with animals by mimicking the surface appearance of a target object through the creation of animal metamers.

BACKGROUND OF THE INVENTION

Hunting and fishing remain essential activities for humanity's recreation in the developed world and our survival in some parts of the developing world. Since before recorded history, humans has been mimicking objects to attract, pacify, repel, or otherwise elicit desired behaviors in animals. These objects have been used as lures, decoys, camouflage, scare devices, coverings, traps and other uses where visually deceiving or otherwise visually convincing an animal was necessary to elicit a desired response.

Human color definition is also an ancient practice that continues to be refined. Isaac Newton famously labeled ROY-G-BIV (red, orange, yellow, green, blue, indigo and violet) when viewing light through a prism. Sensitivity versus wavelength curves of human vision were derived before modern analytical techniques proved that the underlying physical mechanism was light absorption of photoreceptors. These sensitivity curves and experimental research led to the development of accurate human color coordinate systems such as those based around the L,a,b color space (a color-opponent space with dimension "L" for lightness and viable "a" and "b" for the color-opponent dimension) and RGB (Red-Green-Blue) color spaces. It is understood that humans have three types of wavelength discriminating photoreceptors called cones in their retinas which, along with neural circuitry, define the three primary colors RGB from which all human perceived colors can be created by mixing light of these primary colors.

The body of knowledge about animal vision has been growing through observational experiments, and more recently through spectroscopic and genetic techniques. While the number of species examined is small, we now know that birds, fish, mammals, and invertebrates have a variety of color vision systems. Individual species with color vision typically fall into three categories: dichromatic (two types of photoreceptor cones), trichromatic (three types of cones), or tetrachromatic (four types of cones). The spectral sensitivity curves of cone photoreceptors also vary considerably between species. Additional specializations have also been identified. The number of cones and their respective spectral sensitivity curves are significant factors in the perception of color in humans and animals. A cone's spectral sensitivity curve defines which wavelengths produce a neural response and how strongly that response is.

The visual spectrum of animals and human can be likened to a radio dial spectrum. The visual spectrum of humans can be seen by looking at a rainbow or light split in a prism. The spectrum has a beginning and an end similar to how the FM radio dial spectrum goes from 88 megahertz to 108 megahertz. In humans the visual spectrum is generally accepted to run from 400 nanometers (deepest blue/violet) to 700 nanometers (deepest red). Each animal species has its own spectrum with many species perceiving light as low as 320 nanometers for example. The cones can be likened to broad-band radio receivers that "listen" for signals across a wide swath of the spectrum, hearing all stations in their listening band as an aggregated mixed signal and outputting a neural signal relating to the overall loudness of all of the stations in the band. Continuing the radio analogy, some stations on parts of the band are perceived as louder than others of the same radio broadcasting strength because the cone is more sensitive to the center of its band and less sensitive toward the edges of the band (defined by the spectral sensitivity curve). In reality, the band is a wide swath of the animal's perceivable rainbow (visual spectrum) and the determination of aggregate "loudness" (or neural signal strength) of the band is achieved by the combined neural signal of many proximal (nearby) cones of the same type on the retina.

A retina contains the photoreceptors of an eye in a repeating mosaic pattern and is analogous to an image sensor array on a digital camera. Continuing with the analogy, a small grouping of photoreceptors making up the repeating unit in the mosaic pattern can be thought of, for illustrative purposes, as defining a pixel (all of the pixels together define the image). What color that retinal "pixel" is perceived to be, by the brain of the animal or human, is determined by the signal coming from the neural circuitry that is part of the pixel consisting of nerve cells surrounding the photoreceptors. The perceived pixel color is determined by the ratio of the effective signal strengths of the different types of cones on each pixel.

Continuing the pixel analogy, a dichromatic animal, with two types of cones, perceives color of the retinal "pixel" based on the signal strength ratio of just two cone signal channels (because a dichromatic animal only has two types of cones, each with a spectral sensitivity curve covering a wide swath of the visual spectrum). A trichromatic animal (including humans) perceives the color of a pixel based on the ratio of three cone signal channels. A tetrachromatic animal has four cone channels. It's important to note that just because, for example, two species might both be trichromatic, they do not necessarily perceive the same colors for the same "pixel" areas of an image. The cone's spectral sensitivity curve defines the signal strength that affects the ratio of cone signals coming from a "pixel" which determines the color perceived. For two species to perceive the same color from the same pixel area of an image, the number of types of cones, each cone's spectral sensitivity curve, and the visual neural circuitry must be the same. This may occur in species with no genetic difference in the part of their respective DNA which defines the morphology of their visions system. But narrow adaptation is often the norm and even species so close in DNA that interbreeding is possible can have diverging spectral sensitivity curves of their respective cones.

The light spectra that stimulate cones in a retina results in signal channels from each cone type to the brain which perceives the color. That light spectra's photons striking the cone came from a source, such as the sun. The sun, like any light source, has an emission spectra. The emission spectra strike an object, such as a leaf. The leaf absorbs some of the spectra and the rest is reflected and some of the reflected light strikes the eye of the observer. The amount of the spectra that is absorbed is different across the spectra (each wavelength has specific reflection). For the example of the leaf, some areas of the visual spectrum, such as what humans would call blues or reds, are significantly absorbed and the part of the visual spectrum humans perceive as green is absorbed less. The resultant reflectance spectra leaving the leaf's surface is now changed from the sun's incident spectra that hit the leaf. The leaf's reflectance spectra travels to the observer and passes through the ocular media in the observer's eye and finally a portion of the photons of the spectra strike the photoreceptor cells. The ocular media includes the cornea, the aqueous humor, the lens and the vitreous humor. These structures of the ocular media are generally transparent but have areas of the visual spectrum where some absorbance occurs. In fact, the cut-off edge, especially on the shorter wavelength side, of the visual spectrum is often defined by the ocular media. The structures of the ocular media each act as filters, absorbing parts of the incident spectra.

Critical to the present invention is the fact that color "metamers" are two or more light spectra which are not identical yet are perceived as identical colors by an observer. Human metamers are exploited in every color matching technology utilized for paints, plastics, fabrics, film and electronic displays.

A metamer is unique to the observer species. Animal species with differing cone photoreceptor types and specialized sensitivity curves have their own unique metamers. This has been understood by visual neuroscientists and correctly pointed out by Johnson et al in US Patent Application No. 2007/0200337 which teaches avoidance of human metamers by spectral matching when attempting to visually deceive animals. In terms of color matching, the opposite of a metamer match is a spectral match. By matching the spectral reflectance curve of the target object to be mimicked, Johnson teaches that the mimic will appear identical in perceived color to every observer species, regardless of cone photoreceptor type or sensitivity curves. A "spectral match", as taught by Johnson et al, would then enable the mimic to be used for multiple species and no knowledge of the animal's vision system is needed.

"Source metamerism" is the phenomenon where a metamer match is only a metamer match for a particular spectra of incident light shining on a reflecting object. This is most noticeable to humans when two color matched objects are suddenly noticeably different colors when the light source is changed, such as from sunlight to indoor fluorescent lighting.

Numerous patents and applications exist regarding specific colors which purport to elicit specific responses in target animals including the use of human-invisible "colors" such as those in ultraviolet (UV) wavelengths. Yutaka et al in the abstract of JP2002238403 teaches UV reflection in fishing lures, Halliday in U.S. Pat. No. 7,189,128 teaches blue and UV reflection which purport to elicit specific behaviors in fish, and Johnson in US Pat. Application No. 2007/0200337 teaches spectral curve matching to mimic objects including in the ultraviolet wavelengths. Numerous military camouflage patents teach spectral matching of infrared (IR) signatures to avoid detection by IR imagers. Hunting camouflage patents such as Neitz et al in U.S. Pat. No. 5,409,760 teaches coloration which exploits the neutral point of ungulates' (hoofed animals') vision.

Pigments, dyes and other colorants have been extensively classified for their effect on human color coordinates, including their effect when mixed with binders and other colorants. Colorants have cost, performance, toxicity, compatibility and other tradeoffs irrespective of their particular color, which must be taken into account when formulating colored objects. Unfortunately, nature's "colors" such as those found on fur, skin, scales, feathers, bark, leaves and other natural objects are often "colored" with bio-pigments such as carotenoids, chlorophyll, and melanins which are not always hydro-stable, thermo-stable or UV stable, nor are they always compatible with ink and paint solvents and as such can make very poor pigments for man-made coatings. Nature also seldom provides minerals or otherwise coating-friendly pigments or colorants which match the reflectance spectra of the surfaces of living things. Because of this fact, spectral matching is very difficult, expensive, and even (for some spectra) unachievable as a viable man-made coating or colorant system that will last in the field or be affordable. Without spectral curve matching, current man-made objects designed to be observed by animals contain human metamers and as such often look significantly different in color to the target animal. This incorrect animal "color match" can reduce the effectiveness of the object's intended function. What is needed is a method to produce a color match to a target animal without the disadvantages of spectral curve matching.

No accurate models of animal vision systems exist which approach the accuracy of human color coordinate systems. Because of the likelihood that a color which is "matched" to human eyes (a human metamer) will not be a metamer to an animal, the only current approach to successfully mimicking a surface appearance in the eyes of a target animal is through spectral matching as taught by Johnson et al. But given the severe limitations of spectral matching, what is needed is an alternative approach to creating a successful mimic.

No viable methods exist to create animal metamers. Such a method and the compositions created from said method would enable successful mimicry of surfaces without the difficulty and disadvantages of spectral matching. While Johnson et al. teaches the opposite of metamer matching (via spectral matching), the present invention teaches a method of metamer matching to create animal metamers.

What is needed is a method to successfully mimic the appearance of a target object in the visual system of a target animal which is affordable, practical, and achievable. What is needed is a method which creates animal metamers and which can also evaluate how a particular composition would be perceived by multiple species including humans to select the best trade-off composition for a given application. What are needed are technically and commercially viable compositions which impart surface appearances which are metamers of the surface appearances of target objects in the visual system of target animals.

SUMMARY OF THE INVENTION

In one embodiment, a computer or mathematical model of a target animal's vision system is created which incorporates photoreceptor sensitivities and ocular media transmission. A target object to be mimicked is examined using UV-Vis spectroscopy and/or hyper-spectral imaging to obtain quantitative reflectance spectra by wavelength or narrow band region of the light spectrum visible to the target animal. Pigment and colorant spectra across said spectrum are obtained. Measured and/or predicted spectra are entered into said model and the results are compared to the results of the target object and a metamer match score is obtained. Iterative empirical and/or analytical development continues until a satisfactory metamer match score is obtained.

In a further embodiment, computer or mathematical models of pigment/colorant/binder/additive blends are created which predict spectra of said blends and predicted spectra are entered in the vision system model in the embodiment above.

In a further embodiment, models of more than one target animal are created and development proceeds using the above method to obtain metamer matches or satisfactory metamer match scores for more than one target animal. In a further embodiment one of the additional target animals includes humans.

In another embodiment, a decoy with a surface appearance possessing at least one target animal metamer is produced using the above method.

In another embodiment, a camouflage article or object with a surface appearance possessing at least one target animal metamer is produced using the above method.

In another embodiment, a lure with a surface appearance possessing at least one target animal metamer is produced using the above method.

In another embodiment, an object such as those described above (decoy, camouflage, or lure) with a surface appearance possessing at least one target animal metamer, where said metamer is present only in certain types of natural or artificial lighting, is produced using the above method modified to predict source metamerism.

DETAILED DESCRIPTION

Figure 1:
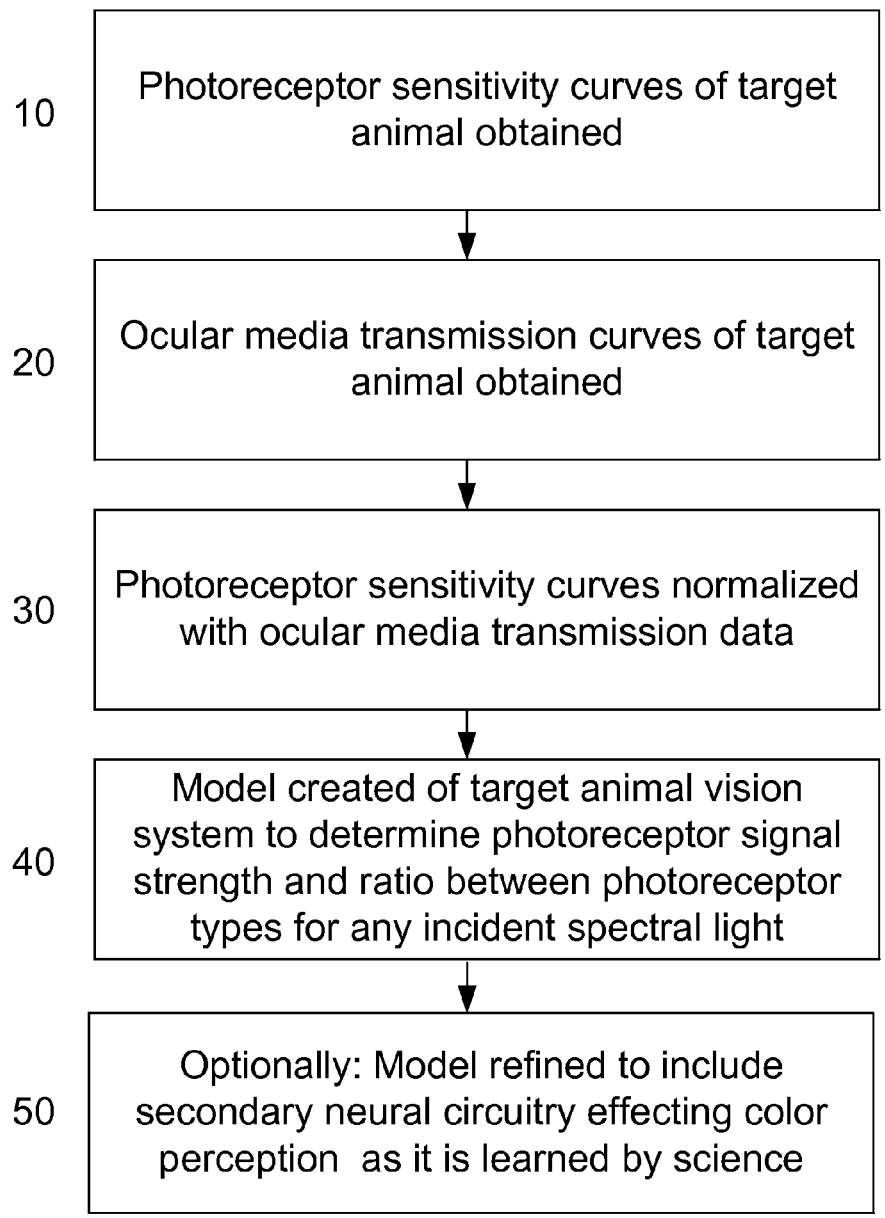
FIG. 1 shows a method wherein the animal vision model is created.
Figure 2:
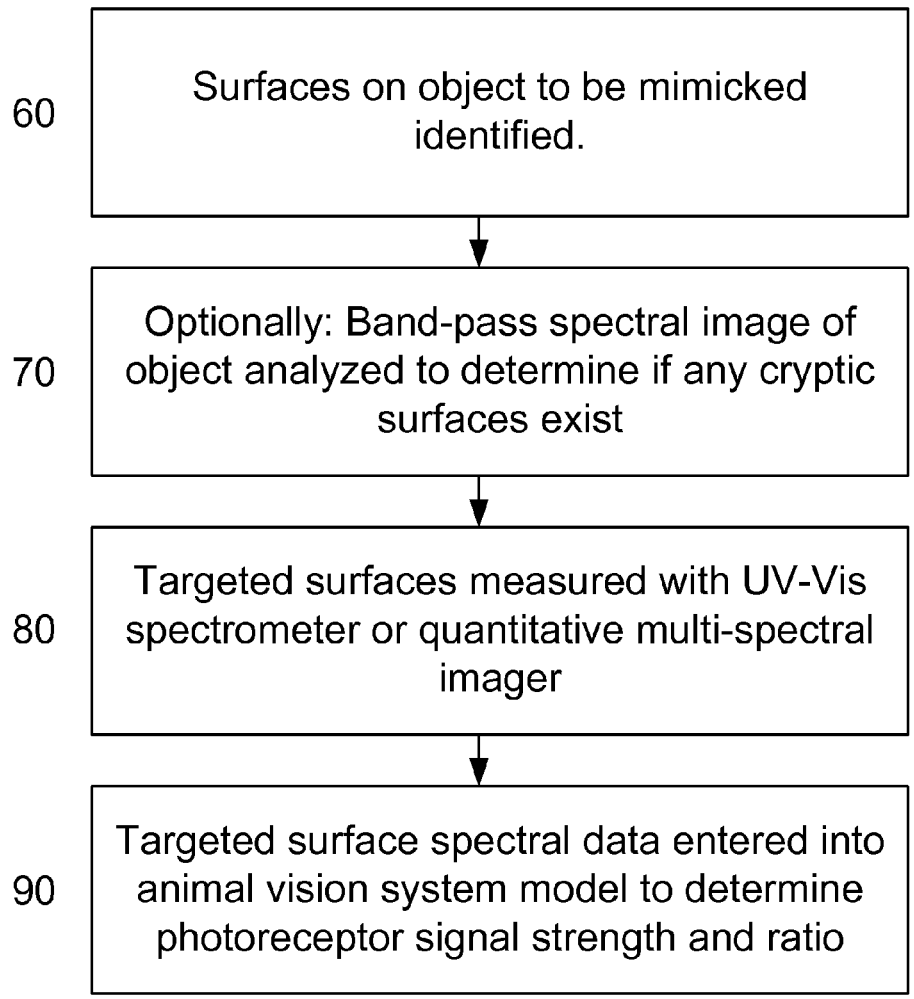
FIG. 2 shows a method wherein the spectra of the surface to be mimicked is measured and entered into the animal vision model.
Figure 3:
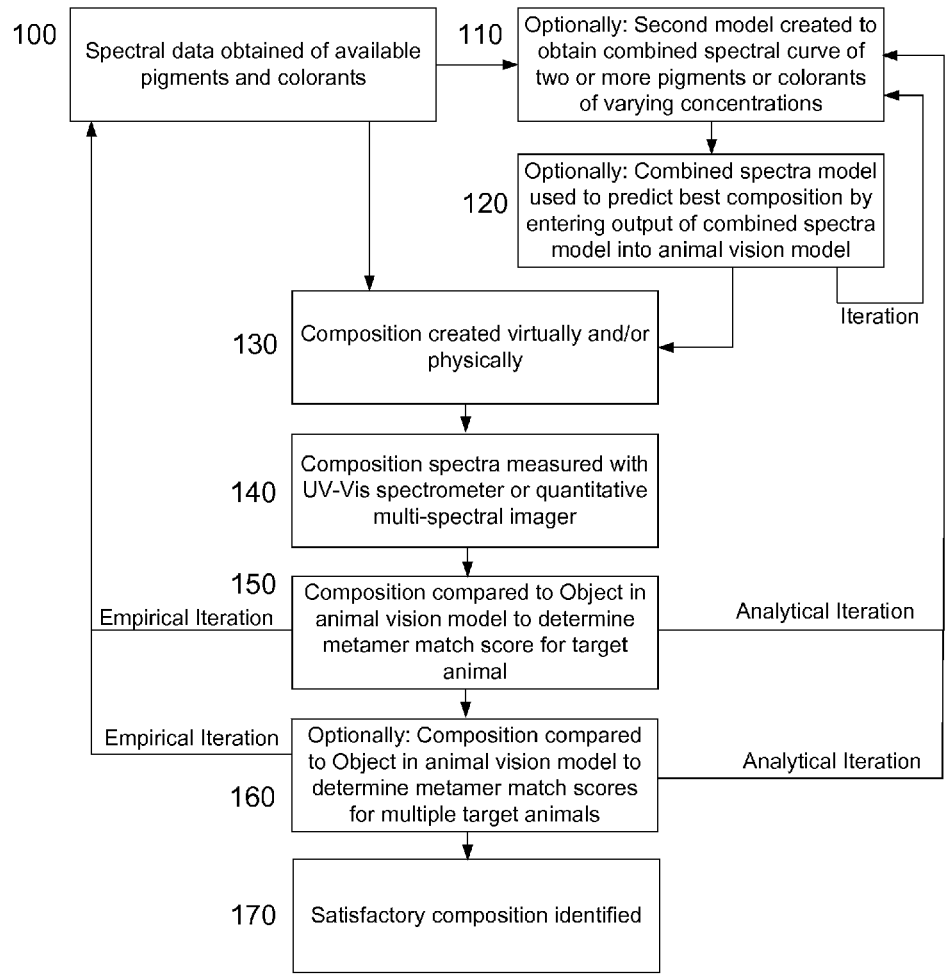
FIG. 3 shows a method wherein compositions of animal metamers are created.

FIGS. 1, 2 and 3 illustrate the method of creating animal vision models and compositions with surface appearances which are animal metamers.

In FIG. 1, a predictive model of a target animal's vision system is created. Data 10, 20 and 50 about the way light interacts with the target animal's eye structures to produce a neural signal is taken from scientific literature or taken directly following techniques outlined in literature. This literature is well understood by those skilled in the art, and a sample of this literature is presented in the References section at the end of this specification. The effects of beta band absorption of opsins and the filtration effects of oil droplets (if present in the target animal) are just some of the factors that must be considered to get accurate sensitivity curves. The literature must be carefully analyzed and assumptions questioned to understand how published sensitivity curves 10 have been normalized or how the data was interpreted to produce the curves. Ocular media transmission 20 must be factored 30 into the model 40 (effecting the incident spectra) to include the filtration effects of the cornea, aqueous humor, lens, and vitreous humor. The model 40 can be created with mathematical equations defining the interaction of photoreceptors, ocular media, and/or secondary neural circuitry 50. The model 40 can also take the form of a large manual spreadsheet on paper with manual calculations between steps. The preferred embodiment is a computer model which allows for ease of use as well as fast and accurate calculations. Many software programs exist that are suitable to build the model including Matlab, Mathematica, Minitab, Microsoft Excel, custom programming and others. The purpose of the model is to calculate the interaction between incident spectra (light entering the eye), the eye's structures (including the transmission, reflection, absorption and other interaction of the structures with the incident spectra which is changing as it passes through the eye's structures), to calculate how retinal structures (photoreceptors and secondary neural circuitry) interpret the modified incident spectra to produce signals in the optic nerve and finally to predict how said optic nerve signals are interpreted in the brain of a target animal (as well as can be known by the latest science).

In FIG. 2, the reflectance spectra (or emission spectra if parts of the target object are luminescent) of one or more surfaces 60 of an object to be mimicked is measured 80 using UV-Vis spectroscopy or quantitative multi-spectral imaging in the wavelengths visible to the target animal. The spectra are entered 90 as incident light in the animal vision model 40. If the possibility for cryptic spectra (spectral difference between objects that are undetectable to humans) exists, an optional step of narrow band-pass imaging 70 can be used to find two or more surfaces on the target object that might be human metamers but contain differing spectra. An example of these cryptic surfaces would be two surfaces with identical human visible reflectance but differing ultraviolet reflectance.

In FIG. 3, candidate materials that could serve as colorants, such as pigments and dyes, are measured 100 using UV-Vis spectroscopy or quantitative multi-spectral imaging in the wavelengths visible to the target animal. If this data is available from the pigment supplier it is converted to a format compatible with the model 40. A second model 110 can be created which calculates the predicted combined spectra of multiple pigments or other composition blends. These predicted spectra can then be entered into the animal vision model 40 and the process 120 iterated to find a suitable candidate composition formula. A candidate composition 130 can be evaluated virtually by entering the predicted data 150 or experimentally by created the candidate composition and measuring the spectra using UV-Vis spectroscopy or quantitative multi-spectral imaging 140 and the data entered into the model and compared 150 against the surface appearance to be mimicked on the target object to obtain a metamer match score. The processes in FIG. 3 can be iterated analytically or empirically until a satisfactory composition 170 is identified. Candidate compositions can be, through additional iteration, compared 160 to determine metamer match scores of more than one target animal.

Figure 4:
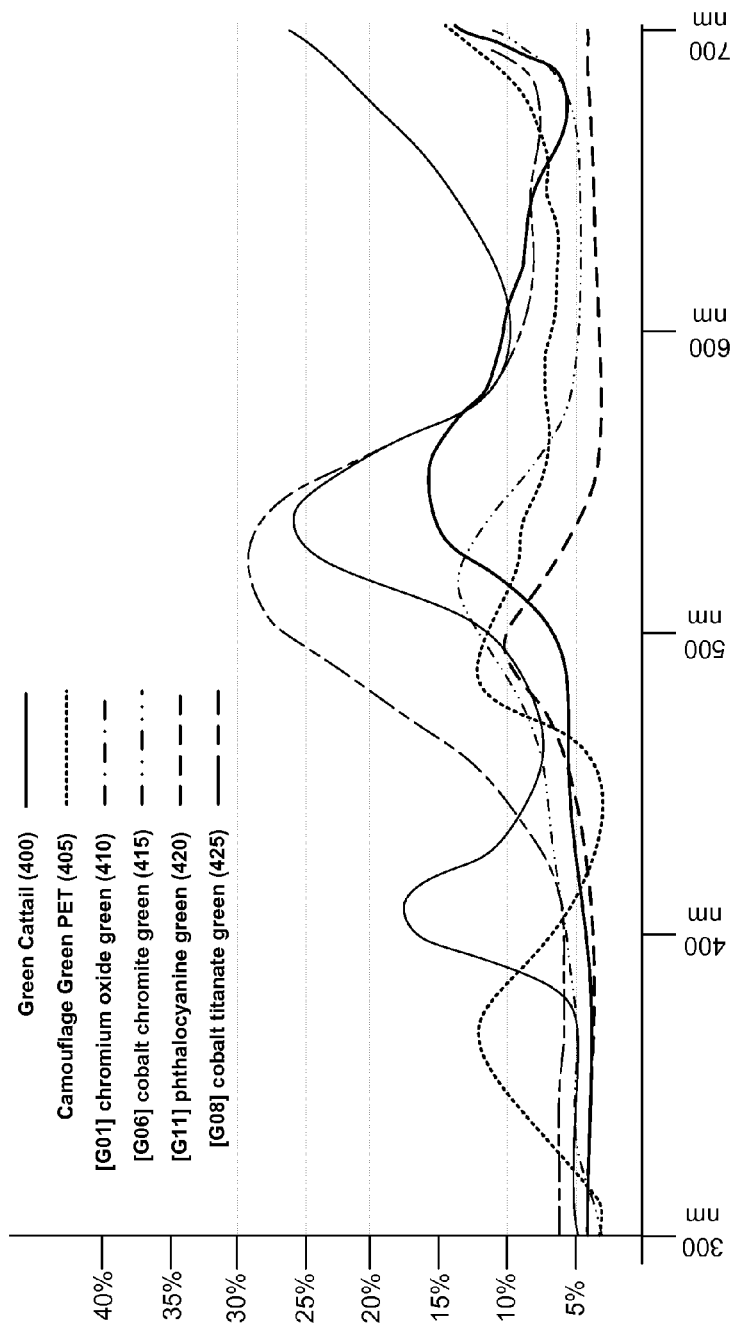
FIG. 4 shows a series of UV-Vis reflectance spectra of various "green" colors.
Figure 5:
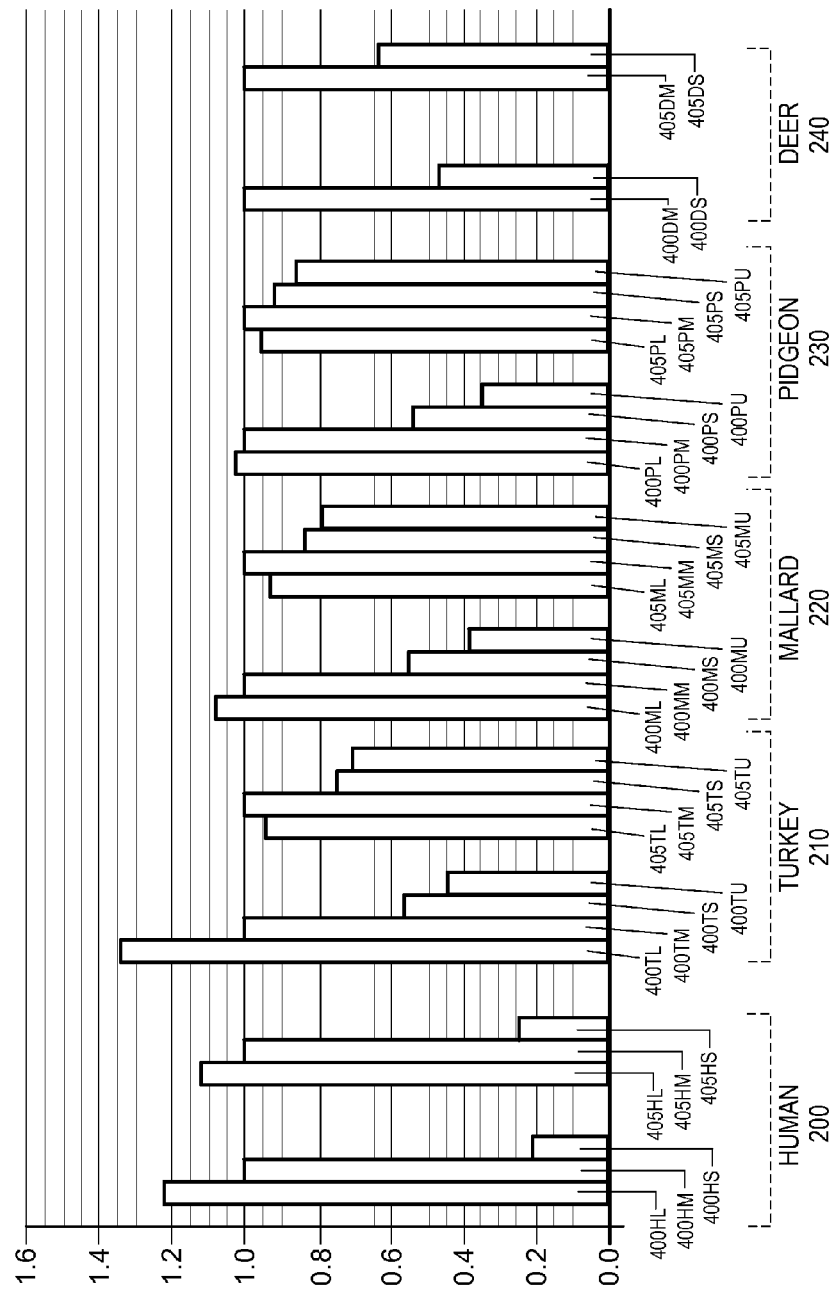
FIG. 5 shows a graphical representation of the metamer match scores of the "green" colors in FIG. 4 for various target animals.

FIG. 4 shows reflectance spectra of a green cattail's flat bladelike leaves 400, the green from a simulated cattail from a green polyester (PET) fabric 405 (chosen by a commercial manufacturer of hunting camouflage to look similar to cattails and other dark green leaves using disperse dyes and transfer printing), and several typical green pigments 410, 415, 420, and 425. A green cattail 400 is chosen only for example. The same method can be applied to any surface including animal skins, feathers, or scales as well as bark, other leaves, soil, grass and any object animate or inanimate. A cattail 400 is a common element in hunting camouflage and is a good choice to illustrate the invention. Note the significant spectral difference between the solid line of the cattail 400 and the dotted line of the camouflage green 405. The solid line 400 exhibits the characteristic chlorophyll curve known to many branches of science. The spectra of other dark green leaves, such as oak leaves, look very similar to the spectral curve of green cattails 400 as the chlorophyll dominates the pigmentation of green leaves. Note that the camouflage green 405 is not even close in curvature (or amplitude) to the curvature of the cattail 400 throughout the spectrum. The pigments and/or dyes used 410, 415, 420, and 435 for the many common green colors have a variety of spectral reflectance curves. It can be seen the phthalocyanine green 420 is the closest colorant in terms of spectral match (of the colorant spectra measured for comparison purposes). The camouflage garment measured was created with standard fabric printing methods which often rely on CMYK color coordinates (described below) so it is unlikely that the camouflage green 405 in question contained only one pigment. The particular process used to make this garment, chosen only for example, was a heat transfer process which relies on sublimation inks. Sublimation inks often require dyes and organic pigments (low viscosity fluidic non-minerals) in order to work well in the heat transfer process so some pigments are unsuitable for this printing method. This would be a classic example of why spectral matching, as taught by Johnson et al. is sometimes unachievable for some colors and manufacturing methods, and when it is achievable is can be burdened with tradeoffs that can ruin the economic viability of a formulation. Using this example, if a spectral curve match were desired (as taught by Johnson et al.), chromium oxide green mixed with carbon black to lower the amplitude would be a good formulation direction to take but may not be available as a commercially viable sublimation disperse dye. Looking at spectra is the measure used to iterate formulations to determine spectral matches, but metamer matches require the use of the animal vision model 40 and the use of a metamer match scoring method. FIG. 5 (described below) details the how the color of the cattail 400 and the camouflage green 405 would be perceived by different game animals.

The CMYK color model (process color, four color) is a subtractive color model, used in color printing, and is also used to describe the printing process itself. CMYK refers to the four inks used in some color printing: cyan, magenta, yellow, and key black. Though it varies by print house, press operator, press manufacturer and press run, ink is typically applied in the order of the abbreviation. The "K" in CMYK stands for key since in four-color printing cyan, magenta, and yellow printing plates are carefully keyed or aligned with the key of the black key plate.

The CMYK model works by partially or entirely masking colors on a lighter, usually white, background. The ink reduces the light that would otherwise be reflected. Such a model is called subtractive because inks "subtract" brightness from white.

In additive color models, such as RGB, white is the "additive" combination of all primary colored lights, while black is the absence of light. In the CMYK model, it is the opposite: white is often the natural color of the fabric or other background, while black results from a full combination of colored inks To save money on ink, and to produce deeper black tones, unsaturated and dark colors are produced by using black ink instead of the combination of cyan, magenta and yellow.

FIG. 5 shows a graphical representation of metamer match scores of the green cattail 400 compared to the camouflage green 405 in FIG. 4. The animal vision model was created using the methods described in the present invention and cone stimulation ratios were chosen for a metamer match scoring method. Because five different vision models were created (human plus four game animals) a common cone type, the medium wavelength sensitive cone (MWS), was chosen to create ratios by setting the value of the MWS cone to 1. Several other methods can be employed to normalize the results for comparison purposes, but normalizing around a common cone type helps reduce the effects of brightness. Setting one of the cone stimulations to one makes possible visual comparisons of bar graphs such as in FIG. 5. It is obvious to one skilled in the art that methods analogous to the well known "delta-E" scoring for L,a,b coordinates or other mathematical tools could be employed to score the differences in cone stimulation. The animal vision models created for this illustration include: human 200, turkey 210, mallard duck 220, pigeon 230, and deer 240. Notice how similar the graphs look between the cattail 400 and the camouflage 405 "greens" for humans 200. This should be no surprise since the camouflage color 405 was matched to a green cattail 400 using human color coordinates and printed onto fabric using inks mixed from those color coordinates. Looking at FIG. 4, the spectral differences between the colored fabric 405 and the cattail 400 is obvious and severe yet the ratio and values of each cone photoreceptor's stimulation in the human model 200 of FIG. 5 shows a good match. The human model 200 of FIG. 5 shows the stimulations created by the green cattail 400 of the human long wavelength sensitive cone (400HL), medium wavelength sensitive cone (400HM), and short wavelength sensitive cone (400HS), as compared to the stimulations created by the camouflage green 405 of the human long wavelength sensitive cone (405HL), medium wavelength sensitive cone (405HM), and short wavelength sensitive cone (405HS). This illustrates a good human metamer match identified using the methods of the present invention, which serves to validate the techniques of the present invention.

Recognizing that this figure illustrates the cone stimulation ratio (factoring in each cone type's sensitivity curve and the filtering effects of the ocular media in the model 40), it should be noted that the human model 200 for the cattail 400 and the camouflage green 405 have similar appearing ratios of the three cone types. The ratios are close but not perfect for the human model. It can be seen that there is a slight difference in the blue stimulation (between 400HS and 405HS), but it is relatively small. This small difference in the ratios is the result of tradeoffs by the dye manufacturer, the transfer printer, and the camouflage company to find a green that is "good enough" to look like cattails. Subjective human perception is used to determine a "good enough" match, and such tradeoffs are common in all industries that employ color.

Now notice the gross mismatch in the graphical metamer match score shown for turkeys 210, mallards 220, pigeons 230, and deer 240. Looking at the individual cone photoreceptor stimulations in the turkey 210, for example, it can be seen that the long wavelength sensitive (400TL and 405TL) cone, the short wavelength sensitive cone (400TS and 405TS) and the ultra-short wavelength sensitive cone (400TU and 405TU) are all mismatched. A turkey, like all avian species examined, is tetrachromatic so there are four cone types. The ultra-short wavelength sensitive mismatch comes from the ultraviolet reflectance peak in the camouflage green 400. The ocular media (specifically the lens) of human eyes filters out ultraviolet light, so humans are blind to this mismatch (this is an example of cryptic spectra). Irrespective of the ultraviolet portion of the spectrum, the spectral variation with the human visible wavelengths (400-700 nm) is also sufficiently divergent to create mismatches in the turkey's long wavelength sensitive and short wavelength sensitive cones. It can be seen that all of the avian (bird) models show a gross mismatch.

Similarly for the deer (which, like all ungulates, is dichromatic), the spectral mismatch results in a short wavelength sensitive (400DS and 405DS) mismatch. With the use of the methods of the present invention, the metamer match scores are used to guide the selection of pigments and other colorants to create compositions with higher scores for the target animal. Because the medium wavelength sensitive (MWS) cone is used as the "anchor" to create easy to view graphical ratios (by being set to one), the MWS cone stimulation is always the same. One can just as easily set any cone type to one and view the data from a different angle. While the value of the ratios are different depending on which cone-type you set to one, all will help guide development by providing a metamer match score.

Metamer match scores can take several forms. A graphical representation of cone stimulation as shown in FIG. 5 is one type of score. It should be obvious that numerous comparative techniques can be employed to quantitatively evaluate the difference to "score" the closeness. Total stimulation could be calculated by summing the cones, which would create a score roughly equivalent to brightness (similar to the L value in human-based L,a,b color space) but incorporating a measure of the cone stimulation is needed to measure color differences. The results could also be normalized to remove brightness to simply compare chromaticity (such as the method employed in FIG. 5 which set one of the cone stimulations to one). Several methods have been developed to assess color-shift and color differences between objects within the human color coordinate systems. One example is "delta-E" which is the square root of the sum of the squares of the shift/difference measured for "L", "a" and "b". This and similar methods could be adapted to define absolute value shifts in cone stimulations for metamer match scores.

Turkeys do not buy camouflage clothing, bass do not buy fishing lures and geese do not buy decoys. In retail applications, human aesthetic is often a requirement. Finding a perfect metamer match score for turkeys that is also a reasonably good metamer match score for deer but is a very poor metamer match score for humans would produces camouflage that looked off-color and mismatched to humans. An educated consumer could choose to purchase this article anyway because of the performance benefits but an un-educated consumer or a consumer concerned about the "fashion" element of hunting camouflage might prefer coloration that looked more real to human eyes. The methods described in this invention enable a designer to choose the metamer match scores for multiple target species to find the best compromise between multiple target animals including the targeted human consumer. Conversely, the methods described in the invention could be used to find an excellent scoring target animal metamer matched surface that is extremely mismatched for humans. This is the intent of blaze orange and other camouflage colors that are designed to be highly noticeable to humans but less noticeable to animals, though they do not incorporate true animal metamers. Using the methods in the present invention this approach could be optimized to produce highly effective camouflage, lures, and decoys that look like natural objects to target animals but are extremely conspicuous, or pleasing, or novel but not necessary "natural" or "correct" to human eyes.

The incident spectra of sunlight changes throughout the day and as cloud conditions change. These incident spectra can also be entered into the model 40 to produce a "source metamerism" score. It may be desirable to produce an article that is a metamer to an animal at twilight but not in the bright sun or vice versa. Possible applications for this approach include a fishing lure that looks highly natural, like that of a bait fish, during lighting condition or times of the day where fish feed on bait fish, but highly unnatural and conspicuous during times in the day or lighting conditions where fish are more prone to non-predatory attacks of objects in their territory.

It should be obvious to one skilled in the art that the present invention can be applied to any application where an animal views an object. All material manufacturing methods (such as painted plastic decoys, or silk screened cotton camouflage shirts) have tradeoffs and requirements that narrow the selection of pigments and binders. A complete list of all possible materials that can be employed to produce animal metamers would be impractically large to include in this specification. The examples in FIG. 4 of commonly known green pigments are just examples. One skilled in the art can find uncommon green pigments and combinations of pigments not considered "green" (such as blues and yellows) which would be candidates using the method described in the invention to produce animal metamers of a target "green". Similarly one skilled in the art can apply this method to create metamer matches of any target "color" (green being chosen for illustrative purposes). It should be understood that green is a human color perception and that metamer matchers are created for spectrally distinct surfaces and using human eyes to identify target surfaces can result in missing cryptic spectra.

DEFINITIONS

As used herein, "metamer" is two or more light spectra which are not identical yet are perceived as identical colors by an observer.

As used herein, "metamer match" is when the cone photoreceptor stimulation ratio of an observer animal is the same for both a target object and a composition.

As used herein, "metamer match score" or "score" is any qualitative or quantitative measurement of the degree of metamer match. A graphical display of cone stimulation ratios, as in FIG. 5 is one example of a metamer match score and scoring method.

As used herein, "ultraviolet" is light with wavelengths less than 400 nanometers (nm) and greater than 300 nm. Less than 320 nm is not relevant to the present invention because most sunlight hitting earth (having filtered through the atmosphere) is extremely faint below 320 nm and no target animals have been identified with sensitivity at wavelengths shorter than that of atmospherically penetrated sunlight.

As used herein, "hyper-spectral imaging" is imaging of narrow wavelength bands. It can be quantitative if reference standards are used and care is taken to prevent saturation of the imaging sensor.

As used herein, "photoreceptor" refers to a retinal structure that creates a neural signal in the presence of certain light wavelengths. Cone photoreceptors have sensitivity curves which typically cover a portion of the total visual spectrum with overlapping sensitivities to other cone types. Cones are typically categorized by their peak wavelength and the placement of that peak wavelength along the spectrum. Typical cone category names include the descriptors long wavelength sensitive (LWS), medium (MWS), short (SWS), and ultra-short (USS). Ultra-short wavelength sensitive cones can also be called violet-sensitive (VS) or ultraviolet sensitive (US) depending on their peak wavelength.

As used herein, "animal" refers to non-humans animals.

As used herein, "spectral curve matching" (or "spectral matching") refers to a method as taught by Johnson et al. wherein a surface appearance is created which closely matches the curvature of the reflectance spectra of a target surface to me mimicked.

As used herein, "camouflage" refers to any material or object intended to render the material, object or wearer less visible or conspicuous to a target animal.

As used herein, "decoy" is a replica of an object, most typically an animal, used to convince a target animal that said decoy is real to elicit a desired behavior.

As used herein, "lure" is an object which attracts a target animal most typically by convincing a target animal that said lure is food or a territorial invader.

As used herein, "cryptic spectra" are spectral differences between objects that are undetectable to humans. In a broader definition all human metamers involve cryptic spectra but the narrow definition for this specification refers to a natural object with spectral attributes which are invisible to humans.

As used herein, "RGB" refers to the red-green-blue color spaces used to model human color perception.

As used herein, "L,a,b" refers to the CIE color space where "L" is lightness, "a" is the position on the red/green opponent channel and "b" is the position on the blue/yellow opponent channel.

As used herein, "colorant" is defined to mean any pigment, ink, mineral, organic compound, or other composition which imparts changes in spectral reflectance to another composition.

As used herein, "analytical spectral measuring device" is used to refer to an ultraviolet-visible (UV-Vis) spectrometer or a quantitative multi-spectral imager.

Example 1

A fishing lure created with the methods described in the present invention with surfaces which are metamers to a target game fish. One embodiment is a bass lure designed to look like a bait fish with at least one area on the surface of the lure constituting a metamer of a corresponding surface of the bait fish as perceived by the bass.

Example 2

A decoy created with the methods described in the present invention with surfaces which are metamers to a target game animal. One embodiment is a decoy designed to look like a goose with at least one area on the surface of the decoy constituting a metamer of a corresponding surface of a goose as perceived by the target animal. In another embodiment the decoys has at least two surface that constitute a metamer match to the corresponding surfaces of the animal the decoy is designed to mimic as perceived by the animal the decoy is targeting.

Example 3

A camouflaged pattern, article or material created with the methods described in the present invention with surfaces which are metamers to a target game animal. In another embodiment a green disperse dye is developed using the methods described wherein said dye is a metamer of a green target leaf (as perceived by a modeled target animal). In another embodiment a green silk screen ink is developed using the methods described wherein said ink is a metamer of a green target leaf (as perceived by a modeled target animal).

Example 4

A coating composition is created with the methods described in the present invention which, when applied, creates a surface on an object which is a metamer to a target animal.

Example 5

A computer model of the vision system of a animal is created which incorporates the ocular media transmission and the cone photoreceptor sensitivity curves of the target animal species which outputs a cone stimulation ratio for each UV-Vis spectral reflectance curves (from measured objects) entered into the model. In another embodied the model is for a game animal species. In a further embodiment the model is of at least one animal species and also includes humans so metamer match scores can be obtained that include scoring of human color matches.

REFERENCES

Hart and Hunt. "Avian Visual Pigments: Characteristics, Spectral Tuning, and Evolution." The American Naturalist, vol. 169, January 2007.

Cuthill, Hart, Partridge, Bennett, Hunt, and Church, "Avian colour vision and avian video playback experiments." Acta Ethol 3:29-37, 2000.

Fritsches, Partridge, Pettigrew and Marshall. "Colour vision in bill fish." Phil. Trans. R. Soc. Lond. B, 2000.

Losey, Nelson, and Zamzow. "Ontogeny of Spectral Transmission in the Eye of the Tropical Damselfish, Dascyllus albisella (Pomacentridae), and Possible Effects on UV Vision." Environmental Biology of Fishes, 59: 21-28, 2000.

Eaton. "Human vision fails to distinguish widespread sexual dichromatism among sexually 'monochromatic' birds." PNAS, vol. 102, no. 31, Aug. 2, 2005.

Levenson, Ponganis, Crognale, Deegan, Dizon, and Jacobs. "Visual pigments of marine carnivores: pinnipeds, polar bear, and sea otter." Journal of Comparative Physiology A-Neuroethology Sensory Neural and Behavioral Physiology. 192 (8), pp. 833-843, 2006.

Odeen and Hastad. "Complex Distribution of Avian Color Vision Systems Revealed by Sequencing the SWS1 Opsin from Total DNA." Mol. Biol. Evol., 20(6):855-861, 2003.

Bowmaker. "Evolution, ecology and spectral tuning of teleost visual pigments." Iugoslav Physiol Pharmacol Acta, Vol. 34, No. 2, 289-303, 1998.

Carroll, Murphy, M. Neitz, Ver Hoeve, and J. Neitz. "Photopigment basis for dichromatic color vision in the horse." Journal of Vision 1, 80-87, 2001.

Beaudet, Flamarique, and Hawryshyn. "Cone Photoreceptor Topography in the Retina of Sexually Mature Pacific Salmonid Fishes", The Journal of Comparative Neurology, 383:49-59, 1997.

Ver Cauteren and Pipas. "A review of color vision in whitetailed deer." Wildlife Society Bulletin, 31(3):684-691, 2003.

Hart, Partridge, and Cuthill. "Visual pigments, cone oil droplets, ocular media, and predicted spectral sensitivity in the domestic turkey (Meleagris gallopavo)." Vision Research 39, 3321-3328, 1999.

Korner, Schlupp, Plath, and Loew. "Spectral sensitivity of mollies: comparing surface- and cave-dwelling Atlantic mollies, Poecilia mexicana." Journal of Fish Biology 69, 54-65, 2006.

Carleton, Harosi, and Kocher. "Visual pigments of African cichlid fishes: evidence for ultraviolet vision from microspectrophotometry and DNA sequences." Vision Research 40, 879-890, 2000.

Losey, Cronin, Goldsmith, Hyde, Marshall, and McFarland. "The UV visual world of fishes: a review." Journal of Fish Biology 54, 921-943, 1999.

Siebeck and Marshall. "Transmission of ocular media in labrid fishes." Phil. Trans. R. Soc. Lond. B 355, 1257-1261, 2005.

Ringvold, Anderssen, Jellum, Bjerkas, Sonerud, Haaland, Devor, and Kjonniksen. "UV-Absorbing Compounds in the Aqueous Humor from Aquatic Mammals and Various Non-Mammalian Vertebrates." Ophthalmic Res 35, 208-216, 2003.

Nelson, Zamzow, and Losey. "Ultraviolet blocking in the ocular humors of the teleost fish *Acanthocybium solandri* (Scombridae)." Can. J. Zool. 79, 1714-1718, 2001.

What is claimed:

1. A camouflage covering comprising at least one surface which has a surface coating composition which is a metamer of a natural object from an environment of an animal as perceived by the vision system of the animal, wherein the surface coating composition is not a spectral match for the natural object, and wherein the surface coating composition is created by a process comprising the steps of:
    (a) creating a mathematical model of the vision system of the animal comprising the steps of:
        using a spectroscopic imaging means to measure a percent light reflectance value reflected from a feature on the animal for each of a plurality of wavelengths of light, wherein said plurality of wavelengths of light includes one or more wavelengths which are visually detectable to the animal but not visually detectable to a human,
        using the measured percent light reflectance values to define a first spectral reflectance curve for the feature on the animal, and
        formulating a surface coating for use on the model of an animal, such that the surface coating has a second spectral reflectance curve which substantially matches the first spectral reflectance curve across any wavelengths which are visually detectable to the animal, wherein the surface coating consists of a synthetic material, and wherein the surface coating does not comprise any portion of an animal;
    (b) measuring a set of spectral characteristics from the natural object; entering the set of spectral characteristics as an input into the mathematical model; and
    (c) using an output of the mathematical model to iteratively create the surface coating composition.

2. The camouflage covering of claim 1 wherein the natural object is selected from the group consisting of plant life, soil, rock, snow, and liquid water.

* * * * *